US010692774B2

(12) United States Patent
Yuki et al.

(10) Patent No.: US 10,692,774 B2
(45) Date of Patent: Jun. 23, 2020

(54) SEMICONDUCTOR DEVICE

(71) Applicant: Rohm Co., Ltd., Kyoto (JP)

(72) Inventors: Hirofumi Yuki, Kyoto (JP); Shuntaro Takahashi, Kyoto (JP); Hiroshi Furutani, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 16/064,682

(22) PCT Filed: Oct. 31, 2016

(86) PCT No.: PCT/JP2016/082198
§ 371 (c)(1),
(2) Date: Jun. 21, 2018

(87) PCT Pub. No.: WO2017/115553
PCT Pub. Date: Jul. 6, 2017

(65) Prior Publication Data
US 2019/0006246 A1 Jan. 3, 2019

(30) Foreign Application Priority Data

Dec. 28, 2015 (JP) .................... 2015-257111

(51) Int. Cl.
*H01L 27/092* (2006.01)
*H01L 29/78* (2006.01)
(Continued)

(52) U.S. Cl.
CPC ........... *H01L 21/823475* (2013.01); *H01L 21/823481* (2013.01); *H01L 27/06* (2013.01);
(Continued)

(58) Field of Classification Search
None
See application file for complete search history.

(56) References Cited

U.S. PATENT DOCUMENTS

| 5,497,285 A | 3/1996 | Nadd |
| 5,550,701 A | 8/1996 | Nadd et al. |

(Continued)

FOREIGN PATENT DOCUMENTS

| JP | H06-104440 | 4/1994 |
| JP | 2011-239242 | 11/2011 |

(Continued)

OTHER PUBLICATIONS

Japan Patent Office, International Search Report for PCT/JP2016/082198 dated Jan. 10, 2017, with English translation.
European Patent Office; Extended European Search Report mailed in counterpart European Patent Application No. 16881533.0 (dated May 31, 2019).

*Primary Examiner* — Jay C Chang
(74) *Attorney, Agent, or Firm* — Fish & Richardson P.C.

(57) ABSTRACT

This semiconductor device comprises: an n-type semiconductor substrate which is connected to an output terminal; a first p-type well which is formed in the n-type semiconductor substrate; a first n-type semiconductor region which is formed in the first p-type well and is connected to a control terminal; and a potential separation part which is connected between the first p-type well and a ground terminal. The potential separation part sets the first p-type well and the ground terminal to a same potential when the output terminal is held at a higher potential than the ground terminal, and sets the first p-type well and the output terminal to a same potential when the output terminal is held at a lower potential than the ground terminal.

18 Claims, 9 Drawing Sheets

(51) Int. Cl.
  *H01L 27/06*    (2006.01)
  *H01L 27/088*   (2006.01)
  *H01L 21/8234*  (2006.01)
  *H03K 17/08*    (2006.01)
  *H01L 21/8238*  (2006.01)

(52) U.S. Cl.
  CPC ........ *H01L 27/088* (2013.01); *H01L 27/0922* (2013.01); *H01L 29/78* (2013.01); *H03K 17/08* (2013.01); *H01L 21/823885* (2013.01); *H01L 21/823892* (2013.01); *H01L 29/7802* (2013.01); *H01L 29/7813* (2013.01)

(56) References Cited

U.S. PATENT DOCUMENTS

| | | | |
|---|---|---|---|
| 2011/0279152 A1* | 11/2011 | Nakahara | H01L 27/0623 327/110 |
| 2013/0106499 A1 | 5/2013 | Yamamoto et al. | |
| 2015/0035568 A1 | 2/2015 | Peng et al. | |
| 2015/0061627 A1 | 3/2015 | Iwata | |

FOREIGN PATENT DOCUMENTS

| | | |
|---|---|---|
| JP | 2012-243930 | 12/2012 |
| JP | 2013-093448 | 5/2013 |
| JP | 2015-053300 | 3/2015 |

\* cited by examiner

SEMICONDUCTOR DEVICE

TECHNICAL FIELD

The present invention relates to semiconductor devices.

BACKGROUND ART

Conventionally, semiconductor devices (for example, low-side switch ICs having a MOSFET (metal-oxide-semiconductor field-effect transistor) with a vertical structure) that do not use an n-type semiconductor substrate but use a p-type semiconductor substrate have been used in various applications.

Examples of the just mentioned conventional technology are seen in Patent Documents 1 and 2 identified below.

LIST OF CITATIONS

Patent Literature

Patent Document 1: Japanese Patent Application published as No. 2011-239242

Patent Document 2: Japanese Patent Application published as No. H06-104440

SUMMARY OF THE INVENTION

Technical Problem

FIG. 9 is a vertical sectional view schematically showing a conventional structure (only the minimum constituent elements necessary for the understanding of a problem) of a semiconductor device. The semiconductor device A in FIG. 9 has an n-type semiconductor substrate A1, a p-type well A2 formed in the n-type semiconductor substrate A1, and an n-type semiconductor region A3 formed in the p-type well A2. The semiconductor device A with this structure has a parasitic transistor QA (an npn-type bipolar transistor) having the n-type semiconductor substrate A1 as its emitter, the p-type well A2 as its base, and the n-type semiconductor region A3 as its collector.

Here, consider a case where the n-type semiconductor substrate A1 is connected to an output terminal OUT, the p-type well A2 is connected to a ground terminal GND, and the n-type semiconductor region A3 is connected to a control terminal IN.

In this case, when the output terminal OUT has a lower potential than the ground terminal GND, the parasitic transistor QA is forward-biased between its base and emitter, and thus the parasitic transistor QA turns ON; accordingly a current IA passes across a path leading from the control terminal IN via the parasitic transistor QA to the output terminal OUT. As a result, a control voltage to be fed to the control terminal IN inconveniently drops; this may adversely affect the operation of the semiconductor device A.

For the reason given above, the semiconductor device A using the n-type semiconductor substrate A1 has not been able to cope with an application where an output terminal OUT can have a lower potential than a ground terminal GND (for example, an application where an inductive load is connected externally to an output terminal OUT).

In view of the above-mentioned problem encountered by the present inventors, an object of the invention disclosed herein is to provide a semiconductor device of which the operation is not affected by an n-type semiconductor substrate having a negative potential.

Means for Solving the Problem

According to one aspect of what is disclosed herein, a semiconductor device includes: an n-type semiconductor substrate connected to an output terminal; a first p-type well formed in the n-type semiconductor substrate; a first n-type semiconductor region which is formed in the first p-type well and which is connected to a control terminal; and a potential separator connected between the first p-type well and a ground terminal. The potential separator is configured to give the first p-type well and the ground terminal an equal potential when the output terminal has a potential higher than that of the ground terminal, and to give the first p-type well and the output terminal an equal potential when the output terminal has a potential lower than that of the ground terminal (a first configuration).

In the semiconductor device according to the first configuration, the potential separator can have: a second p-type well which is formed in the n-type semiconductor substrate and which is connected to the ground terminal; and a second n-type semiconductor region formed in the second p-type well. The first p-type well and the second n-type semiconductor region can be connected to the ground terminal via a shared resistor (a second configuration).

According to another aspect of what is disclosed herein, a semiconductor device includes: an n-type semiconductor substrate connected to an output terminal; a first p-type well formed in the n-type semiconductor substrate; a first n-type semiconductor region which is formed in the first p-type well and which is connected to a control terminal; and a potential separator connected between the first p-type well and a ground terminal. The potential separator has: a second p-type well which is formed in the n-type semiconductor substrate and which is connected to the ground terminal; and a second n-type semiconductor region formed in the second p-type well, and the first p-type well and the second n-type semiconductor region are connected to the ground terminal via a shared resistor (a third configuration).

The semiconductor device according to the second or third configuration can further include an external terminal for externally fitting the resistor (a fourth configuration).

In the semiconductor device according to any one of the second to fourth configurations, the second n-type semiconductor region can be configured to act as the backgate of a dummy pMOSFET formed in the second p-type well (a fifth configuration).

The semiconductor device according to any one of the first to fifth configurations can further include: an output transistor with a vertical structure which is connected between the output terminal and the ground terminal and which is configured to turn ON and OFF according to a control voltage fed from the control terminal; and a controller configured to operate by use of the control voltage as a power source. The first p-well and the first n-type semiconductor region can both be constituent elements of the controller (a sixth configuration).

In the semiconductor device according to the sixth configuration, the controller can include: a pMOSFET connected between the control terminal and the gate of the output transistor; and an nMOSFET connected between the gate of the output transistor and the ground terminal. The first p-type well can be configured to act as the backgate of the nMOSFET, and the first n-type semiconductor region can be configured to act as the backgate of the pMOSFET (a seventh configuration).

According to yet another aspect of what is disclosed herein, an electronic appliance includes: the semiconductor device of any one of the first to seventh configurations; a microcontroller configured to supply a control voltage to a control terminal of the semiconductor device; and a load fitted externally to an output terminal of the semiconductor device (an eighth configuration).

In the electronic appliance according to the eighth configuration, the load can be inductive (a ninth configuration).

In the electronic appliance according to the ninth configuration, the semiconductor device can be a low-side switch IC, a switching power supply IC, or a motor driver IC (a tenth configuration).

According to yet another aspect of what is disclosed herein, a vehicle includes: the electronic appliance according to the tenth configuration; and a battery configured to supply power to the electronic appliance (an eleventh configuration).

Advantageous Effects of the Invention

According to the invention disclosed herein, it is possible to provide a semiconductor device of which the operation is not affected by an n-type semiconductor substrate having a negative potential.

DESCRIPTION OF EMBODIMENTS

<Basic Structure>

Figure 1:
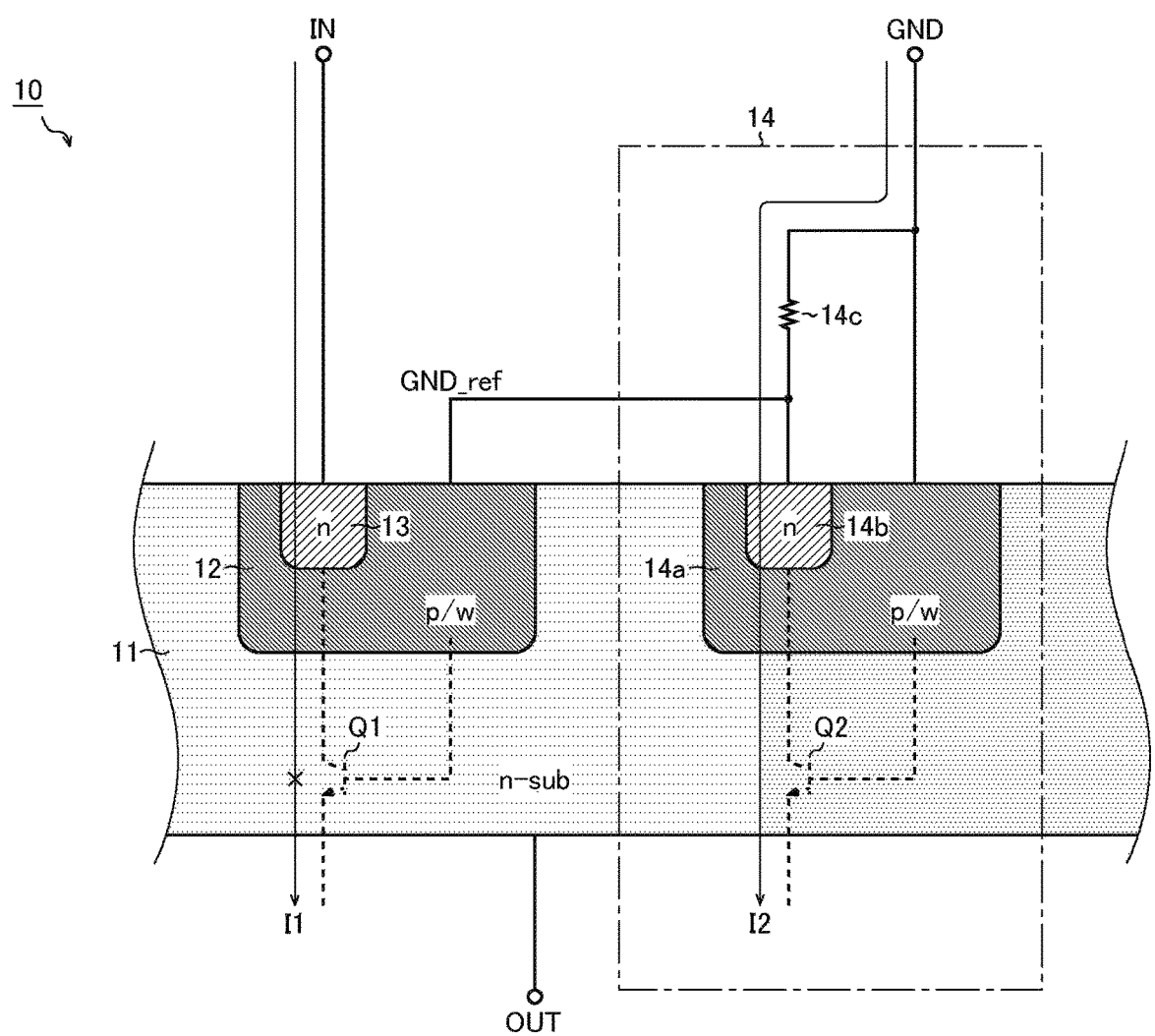
FIG. 1 is a vertical sectional view schematically showing a basic structure of a semiconductor device.

FIG. 1 is a vertical sectional view schematically showing a basic structure (only the minimum constituent elements necessary for the understanding of the invention) of a semiconductor device. The semiconductor device 10 in FIG. 1 has an n-type semiconductor substrate 11 connected to an output terminal OUT, a p-type well 12 formed in the n-type semiconductor substrate 11, an n-type semiconductor region 13 formed in the p-type well 12 and connected to a control terminal IN, and a potential separator 14 connected between the p-type well 12 and a ground terminal GND.

The potential separator 14 has a p-type well 14a formed in the n-type semiconductor substrate 11 and connected to the ground terminal GND and an n-type semiconductor region 14b formed in the p-type well 14a. The p-type well 12 and the n-type semiconductor region 14b are connected to the ground terminal GND via a shared resistor 14c. Hereinafter, the node voltage at the p-type well 12 is represented by GND_ref.

The semiconductor device 10 in FIG. 1 has parasitic transistors Q1 and Q2. The parasitic transistor Q1 is an npn-type bipolar transistor having the n-type semiconductor substrate 11 as its emitter, the p-type well 12 as its base, and the n-type semiconductor region 13 as its collector. On the other hand, the parasitic transistor Q2 is an npn-type bipolar transistor having the n-type semiconductor substrate 11 as its emitter, the p-type well 14a as its base, and the n-type semiconductor region 14b as its collector.

First, consider a case where the output terminal OUT has a higher potential than the ground terminal GND. In this case, the parasitic transistor Q2 is reverse-biased between its base and emitter, and thus the parasitic transistor Q2 does not turn ON. Thus, no current I2 passes across a path leading from the ground terminal GND via the resistor 14c and the parasitic transistor Q2 to the output terminal OUT.

As a result, the p-type well 12 has a potential equal to that of the ground terminal GND (GND_ref=GND), and thus the parasitic transistor Q1 is also reverse-biased between its base and emitter. Accordingly, the parasitic transistor Q1 does not turn ON either, and thus no current I1 passes across a path leading from the control terminal IN via the parasitic transistor Q1 to the output terminal OUT.

Next, consider a case where the output terminal OUT has a lower potential than the ground terminal GND. In this case, the parasitic transistor Q2 is forward-biased between its base and emitter, and thus the parasitic transistor Q2 turns ON; accordingly, a current I2 passes across the path leading from the ground terminal GND via the resistor 14c and the parasitic transistor Q2 to the output terminal OUT.

As a result, once the parasitic transistor Q2 is saturated, the p-type well 12 has a potential equal to that of the output terminal OUT (GND_ref=OUT); thus, no potential difference occurs between the base and emitter of the parasitic transistor Q1. Thus, the parasitic transistor Q1 does not turn ON, and accordingly no current I1 passes across the path leading from the control terminal IN via the parasitic transistor Q1 to the output terminal OUT.

That is, the potential separator 14 serves to give the p-type well 12 and the ground terminal GND an equal potential when the output terminal OUT has a higher potential than the ground terminal GND, and to give the p-type well 12 and the output terminal OUT an equal potential when the output terminal OUT has a lower potential than the ground terminal GND.

Figure 9:
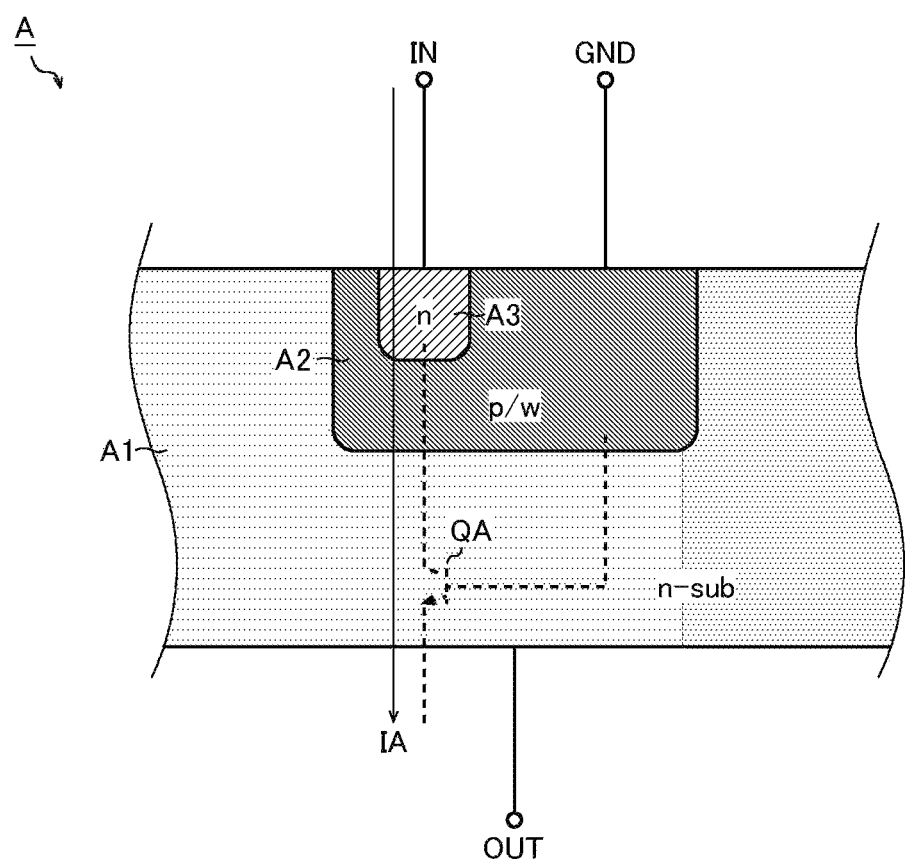
FIG. 9 is a vertical sectional view schematically showing a conventional structure of a semiconductor device.

Thus, with this structure in which the node voltage GND_ref at the p-type well 12 is switched as necessary by use of the potential separator 14, unlike with the conventional structure (see FIG. 9 referred to earlier) in which the p-type well 12 is connected directly to the ground terminal GND, even when the n-type semiconductor substrate 11 has a negative potential (OUT<GND), the parasitic transistor Q1 does not turn ON. Thus, it is possible to prevent a drop in the voltage at the control terminal IN, and thus to maintain the normal operation of the semiconductor device 10.

The p-type well 12 and the p-type well 14a are preferably arranged at a sufficient distance from each other so as not to electrically conduct to each other. Or, an element isolation region (such as a collector wall or an insulation trench) may be arranged between the p-type well 12 and the p-type well 14a. With this arrangement, no parasitic transistor is formed that has the n-type semiconductor substrate 11 as its emitter, the p-type well 14a as its base, and the n-type semiconductor region 13 as its collector. That is, no current I2 passes across such a path as to lead from the control terminal IN over to the collector of the parasitic transistor Q2.

The resistance value of the resistor 14c is preferably adjusted as necessary to a necessary and sufficient value according to the current capacity of the parasitic transistor Q2. More specifically, the higher the current capacity of the parasitic transistor Q2 is, the lower the resistance value of the resistor 14c can be set, and the lower the current capacity of the parasitic resistor Q2 is, the higher the resistance value of the resistor 14c can be set. Here, consideration needs to be given to the fact that noise is more likely to appear in the node voltage GND_ref if the resistance value of the resistor 14c is set too high.

<Low-Side Switch IC>

Figure 2:
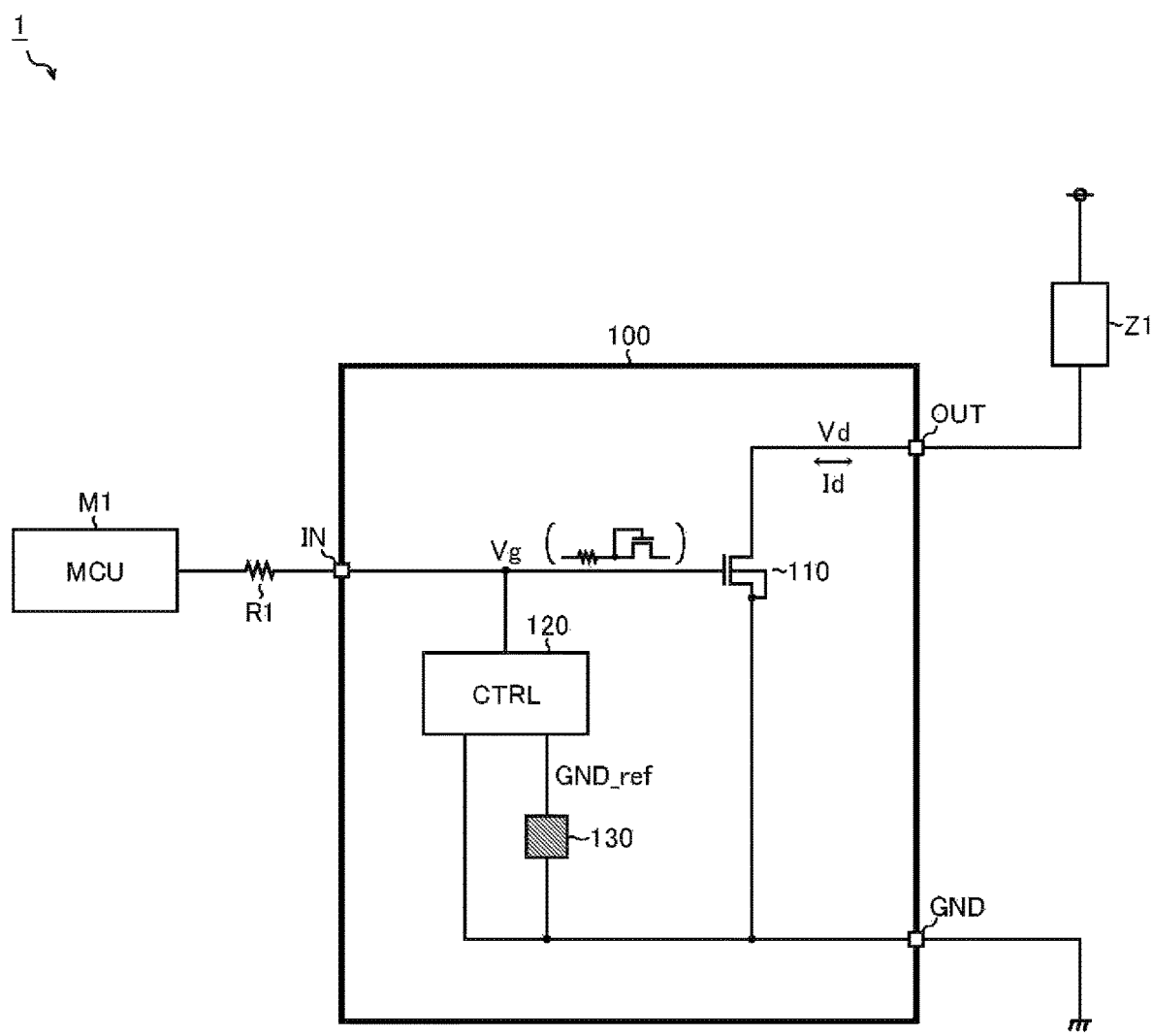
FIG. 2 is an application diagram showing an example of application to a low-side switch IC.

FIG. 2 is an application diagram showing an example of application to a low-side switch IC. An electronic appliance 1 shown as an example in FIG. 2 has a semiconductor device 100, and further has a microcontroller M1, a load Z1, and a resistor R1, which are externally fitted to the semiconductor device 100.

The semiconductor device 100 functions as what is called a low-side switch IC, and is composed of an output transistor 110, a controller 120, and a potential separator 130 integrated together. The semiconductor device 100 has, as a means for establishing electrical connection with the outside, a control terminal IN, an output terminal OUT (load connection terminal), and a ground terminal GND.

To the control terminal IN, a control voltage Vg (for example, a rectangular-wave voltage which is pulse-driven between 0 V and 5 V) is fed from the microcontroller M1 via the resistor R1 (for example, several hundred ohms). Between the output terminal OUT and a power line, the load Z1 is externally fitted. The ground terminal GND is connected to a ground line.

The output transistor 110 is connected between the output terminal OUT and the ground terminal GND, and is a low-side switch (an nMOSFET in FIG. 2) which conducts and cuts off the path between the load Z1 and the ground line according to the control voltage Vg. The drain of the output transistor 110 is connected to the output terminal OUT. The source and the backgate of the output transistor 110 are both connected to the ground terminal GND. The gate of the output transistor 110 is connected to the control terminal IN (a terminal to which a control voltage Vg is applied). The output transistor 110 turns ON when the control voltage Vg turns to high level, and turns OFF when the control voltage Vg turns to low level.

Through the output transistor 110, a drain current Id passes that reflects the ON/OFF state of the output transistor 110. In the present specification, whether the drain current Id is positive or negative is defined as follows: The direction from the output terminal OUT via the output transistor 110 toward the ground terminal GND is positive (Id>0), while the direction from the ground terminal GND via the output transistor 110 toward the output terminal OUT is negative (Id<0).

The drain voltage Vd at the output transistor 110 is positive (Vd>0, that is, OUT>GND) when a positive drain current ID passes through the output transistor 110, and is negative (Vd<0, that is, OUT<GND) when a negative drain current Id passes through the output transistor 110. For example, when an inductive load is externally fitted as the load Z1, a negative drain current Id may pass through the output transistor 110, and thus the drain voltage Vd may become negative.

The controller 120 is connected between the control terminal IN and the ground terminal GND, and is an analog controller which operates by use of the control voltage Vg as a power source. That is, the controller 120 operates only when the control voltage Vg is at high level (when the output transistor 110 is ON), and stops its operation when the control voltage Vg turns to low level.

The potential separator 130 is connected between the ground terminal GND and a p-type well 121 (see FIG. 3) in which the controller 120 is formed, and gives the p-type well 121 and the ground terminal GND an equal potential (GND_ref=GND) when the output terminal OUT has a higher potential than the ground terminal GND, and gives the p-type well 121 and the output terminal OUT an equal potential (GND_ref=OUT) when the output terminal OUT has a lower potential than the ground terminal GND. That is, the potential separator 130 corresponds to the potential separator 14 in FIG. 1.

Although FIG. 2 shows, for the sake of simple illustration, an example of a structure in which the control terminal IN and the gate of the output transistor 110 are directly connected together, this is in no way meant to limit the structure of the semiconductor device 100; instead, for example, as shown in the parentheses in FIG. 2, between the control terminal IN and the output transistor 110, a resistor and a switch which remains OFF until the control voltage Vg applied to the control terminal IN reaches a predetermined value may be provided. In that case, strictly speaking, the control terminal IN and the gate of the transistor 110 constitute separate nodes, and hence the control voltage Vg applied to the control terminal IN and the voltage at the gate of the transistor 110 are separate voltages.

Figure 3:
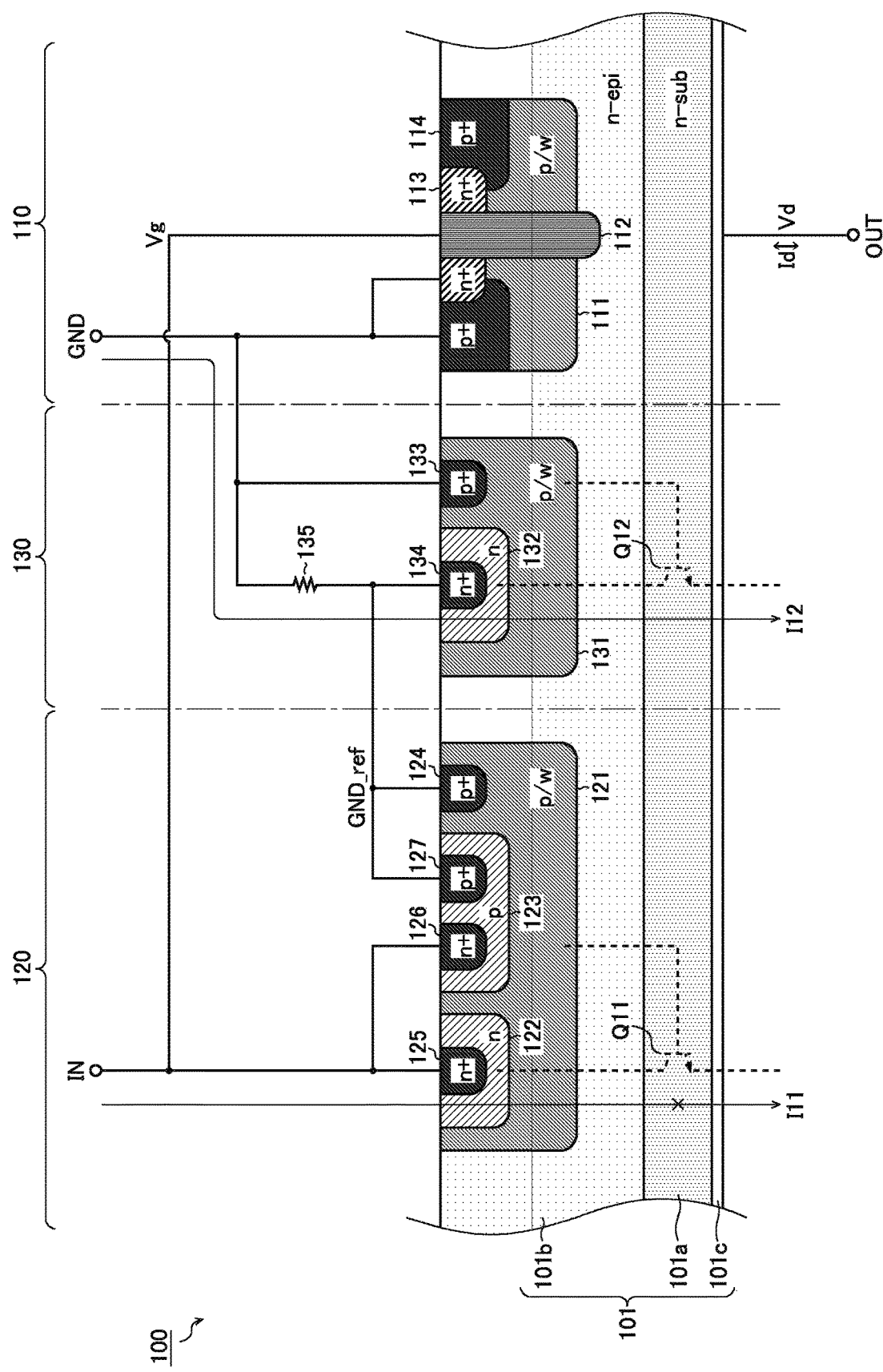
FIG. 3 is a vertical sectional view schematically showing a first structure example of a semiconductor device.

FIG. 3 is a vertical sectional view schematically showing a first structure example of the semiconductor device 100. The semiconductor device 100 in FIG. 3 is composed of an output transistor 110, a controller 120, and a potential separator 130 integrated together on an n-type semiconductor substrate 101. For the sake of simple illustration, dimensions (thicknesses, widths, and the like) of constituent elements may be exaggerated.

First, the n-type semiconductor substrate 101 will be described. The n-type semiconductor substrate 101 includes, as its base, an n-type substrate layer 101a. On the obverse face of the n-type substrate layer 101a, an n-type epitaxial growth layer 101b is formed over the entire surface. On the reverse face of the n-type substrate layer 101b, a substrate electrode 101c is formed over the entire surface. The substrate electrode 101c is connected, as the drain of the output transistor 110, to an output terminal OUT. The n-type semiconductor substrate 101 corresponds to the n-type semiconductor substrate 11 in FIG. 1.

Next, the output transistor 110 will be described. In a region where the output transistor 110 is formed, a p-type well 111 is formed in the n-type semiconductor substrate 101. In the p-type well 111, a trench gate 112 is formed that extends from the obverse face of the p-type well 111 to the n-type epitaxial growth layer 101b. The trench gate 112 has its inner wall surface coated with gate oxide film, and is filled inside with gate polysilicon. Near the obverse face of the p-type well 111, around the trench gate 112, a high-doped n-type semiconductor region 113 is formed, and around the high-doped n-type semiconductor region 113, a high-doped p-type semiconductor region 114 is formed. The trench gate 112 is connected to a control terminal IN (a terminal to which a control voltage Vg is applied). The high-doped n-type semiconductor region 113 and the high-doped p-type semiconductor region 114 are both connected to a ground terminal GND.

In the output transistor 110 with a vertical structure as described above, the high-doped n-type semiconductor region 113 functions as a source, the n-type semiconductor substrate 101 functions as a drain, the trench gate 112 functions as a gate, and the p-type well 111 (along with the high-doped p-type semiconductor region 114 acting as the contact of the p-type well 111) functions as a backgate.

Although FIG. 3 shows, for the sake of simple illustration, an example where the output transistor 110 is formed as a single cell, this is in no way meant to limit the structure of the output transistor 110; instead, one output transistor 110 may be formed by a large number of unit cells connected in parallel. Notably, the output transistor 110 of a trench gate type allows miniaturization of unit cells, and this helps achieve a lower ON resistance (several tens of milliohms) in the output transistor 110.

Next, the controller 120 will be described. In a region where the controller 120 is formed, a p-type well 121 is formed in the n-type semiconductor substrate 101. In the p-type well 121, there are formed a low-doped n-type semiconductor region 122, a low-doped p-type semiconductor region 123, and a high-doped p-type semiconductor region 124. In the low-doped n-type semiconductor region 122, a high-doped n-type semiconductor region 125 is formed. In the low-doped p-type semiconductor region 123, a high-doped n-type semiconductor region 126 and a high-doped p-type semiconductor region 127 are formed. The high-doped n-type semiconductor regions 125 and 126 are both connected to the control terminal IN. The high-doped p-type semiconductor region 124 and the high-doped p-type semiconductor region 127 are both connected to the ground terminal GND via a resistor 135.

The above-mentioned constituent elements 121 to 127 are an extraction of, of a plurality of constituent elements forming the controller 120, only those which have their counterparts in the basic structure in FIG. 1. More specifically, the p-type well 121 (along with the high-doped p-type semiconductor region 124 acting as the contact of the p-type well 121) corresponds to the p-type well 12 in FIG. 1, and so does the low-doped p-type semiconductor region 123 (along with the high-doped p-type semiconductor region 124 acting as the contact of the low-doped p-type semiconductor region 123). On the other hand, the low-doped n-type semiconductor region 122 (along with the high-doped n-type semiconductor region 125 acting as the contact of the low-doped n-type semiconductor region 122) corresponds to the n-type semiconductor region 13 in FIG. 1, and so does the high-doped n-type semiconductor region 126.

Thus, the p-type well 12 and the n-type semiconductor region 13 in FIG. 1 are both implemented as constituent elements of the controller 120.

Now, the potential separator 130 will be described. In a region where the potential separator 130 is formed, a p-type well 131 is formed in the n-type semiconductor substrate 101. In the p-type well 131, a low-doped n-type semiconductor region 132 and a high-doped p-type semiconductor region 133 are formed. In the low-doped n-type semiconductor region 132, a high-doped n-type semiconductor region 134 is formed. The high-doped p-type semiconductor region 133 is connected directly to the ground terminal GND. On the other hand, the high-doped n-type semiconductor region 134 is connected to the ground terminal GND via the resistor 135.

The above-mentioned constituent elements 131 to 135 are an extraction of, of a plurality of constituent elements forming the potential separator 130, only those which have their counterparts in the basic structure in FIG. 1. More specifically, the p-type well 131 (along with the high-doped p-type semiconductor region 133 acting as the contact of the p-type well 131) corresponds to the p-type well 14a in FIG. 1. On the other hand, the low-doped n-type semiconductor region 132 (along with the high-doped n-type semiconductor region 134 acting as the contact of the low-doped n-type semiconductor region 132) corresponds to the n-type semiconductor region 14b in FIG. 1. The resistor 135 corresponds to the resistor 14c in FIG. 1.

The semiconductor device 100 in FIG. 3, like the previously-described basic structure (FIG. 1), has parasitic transistors Q11 and Q12. The parasitic transistor Q11 is an npn-type bipolar transistor having the n-type semiconductor substrate 101 as its emitter, the p-type well 121 as its base, and the low-doped n-type semiconductor region 122 as its collector. On the other hand, the parasitic transistor Q12 is an npn-type bipolar transistor having the n-type semiconductor substrate 101 as its emitter, the p-type well 131 as its base, and the low-doped n-type semiconductor region 132 as its collector.

First, consider a case where the output terminal OUT has a higher potential than the ground terminal GND. In this case, the parasitic transistor Q12 is reverse-biased between its base and emitter, and thus the parasitic transistor Q12 does not turn ON. Thus, no current I12 passes across a path leading from the ground terminal GND via the resistor 135 and the parasitic transistor Q12 to the output terminal OUT.

As a result, the p-type well 121 has a potential equal to that of the ground terminal GND (GND_ref=GND), and thus the parasitic transistor Q11 is also reverse-biased between its base and emitter. Accordingly, the parasitic transistor Q11 does not turn ON either, and thus no current I11 passes across a path leading from the control terminal IN via the parasitic transistor Q11 to the output terminal OUT.

Next, consider a case where the output terminal OUT has a lower potential than the ground terminal GND. In this case, the parasitic transistor Q12 is forward-biased between its base and emitter, and thus the parasitic transistor Q12 turns ON; accordingly, a current I12 passes across the path leading from the ground terminal GND via the resistor 135 and the parasitic transistor Q12 to the output terminal OUT.

As a result, once the parasitic transistor Q12 is saturated, the p-type well 121 has a potential equal to that of the output terminal OUT (GND_ref=OUT); thus, no potential difference occurs between the base and emitter of the parasitic transistor Q11. Thus, the parasitic transistor Q11 does not turn ON, and accordingly no current passes across the path leading from the control terminal IN via the parasitic transistor Q11 to the output terminal OUT.

That is, the potential separator 130 serves, like the potential separator 14 with the basic structure (FIG. 1), to give the p-type well 121 and the ground terminal GND an equal potential when the output terminal OUT has a higher potential than the ground terminal GND, and to give the p-type well 121 and the output terminal OUT an equal potential when the output terminal OUT has a lower potential than the ground terminal GND.

Figure 4:
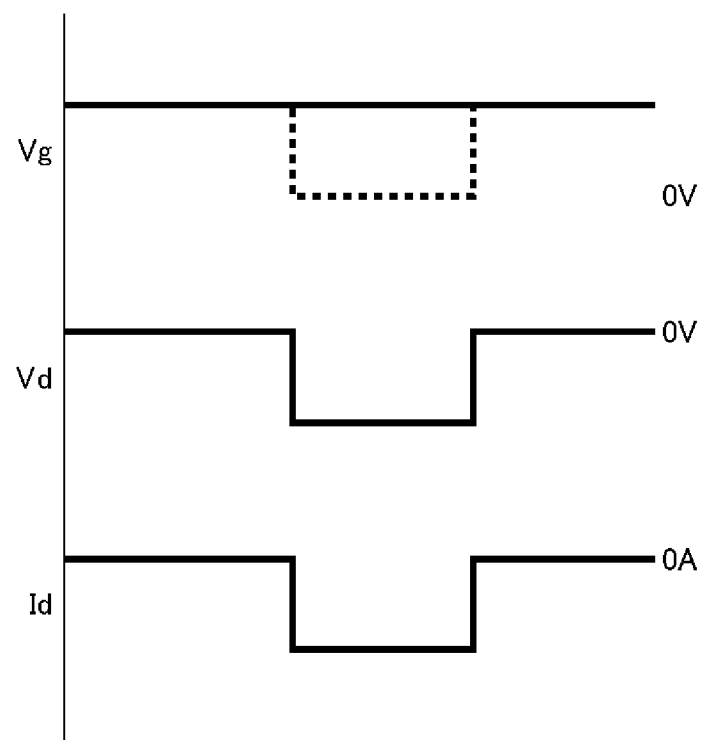
FIG. 4 is a waveform diagram showing the behavior observed when a negative output is yielded.

FIG. 4 is a waveform diagram showing the behavior of the semiconductor device 100 observed when the semiconductor device 100 is yielding a negative output (OUT<GND), depicting, from top down, the control voltage Vg, the drain voltage Vd, and the drain current Id. For the control voltage Vg, the solid line represents the behavior observed when the potential separator 130 is provided, and the broken line represents the behavior observed when no potential separator 130 is provided.

Once a negative drain current Id passes through the output transistor 110, the drain voltage Vd becomes negative. Here, with no potential separator 130 provided, a current I11 passes across the path leading from the control terminal IN via the parasitic transistor Q11 to the output terminal OUT. The microcontroller M1 connected to the control terminal IN generally has a low driving capacity (current capacity) for the control voltage Vg. Thus, if the current I11 is drawn in from the control terminal IN via the parasitic transistor Q11, the control voltage Vg greatly drops, and this may adversely affect the operation of the semiconductor device 100.

On the other hand, with the potential separator 130 provided, even when the drain voltage Vd becomes negative, the parasitic transistor Q11 does not turn ON; thus, it is possible to prevent a drop in the voltage at the control terminal IN, and hence to maintain the normal operation of the semiconductor device 100.

Thus, the semiconductor device 100 can cope with, with no trouble, even an application where the output terminal OUT can have a lower potential than the ground terminal GND, and so offers enhanced versatility (flexibility in selection of the load Z1).

The DC current amplification factor hFE of the parasitic transistor Q11 has a positive temperature response; thus, the higher the temperature Ta is, the more likely a high current I11 passes, and the more likely the control voltage Vg drops. In view of this, in an application (for example, when the electronic appliance 1 is mounted in a vehicle) which requires high operation reliability in a high-temperature environment (for example Ta=160° C.), it can be said that the potential separator 130 performs a very important function by preventing the parasitic transistor Q11 from tuning ON.

Figure 5:
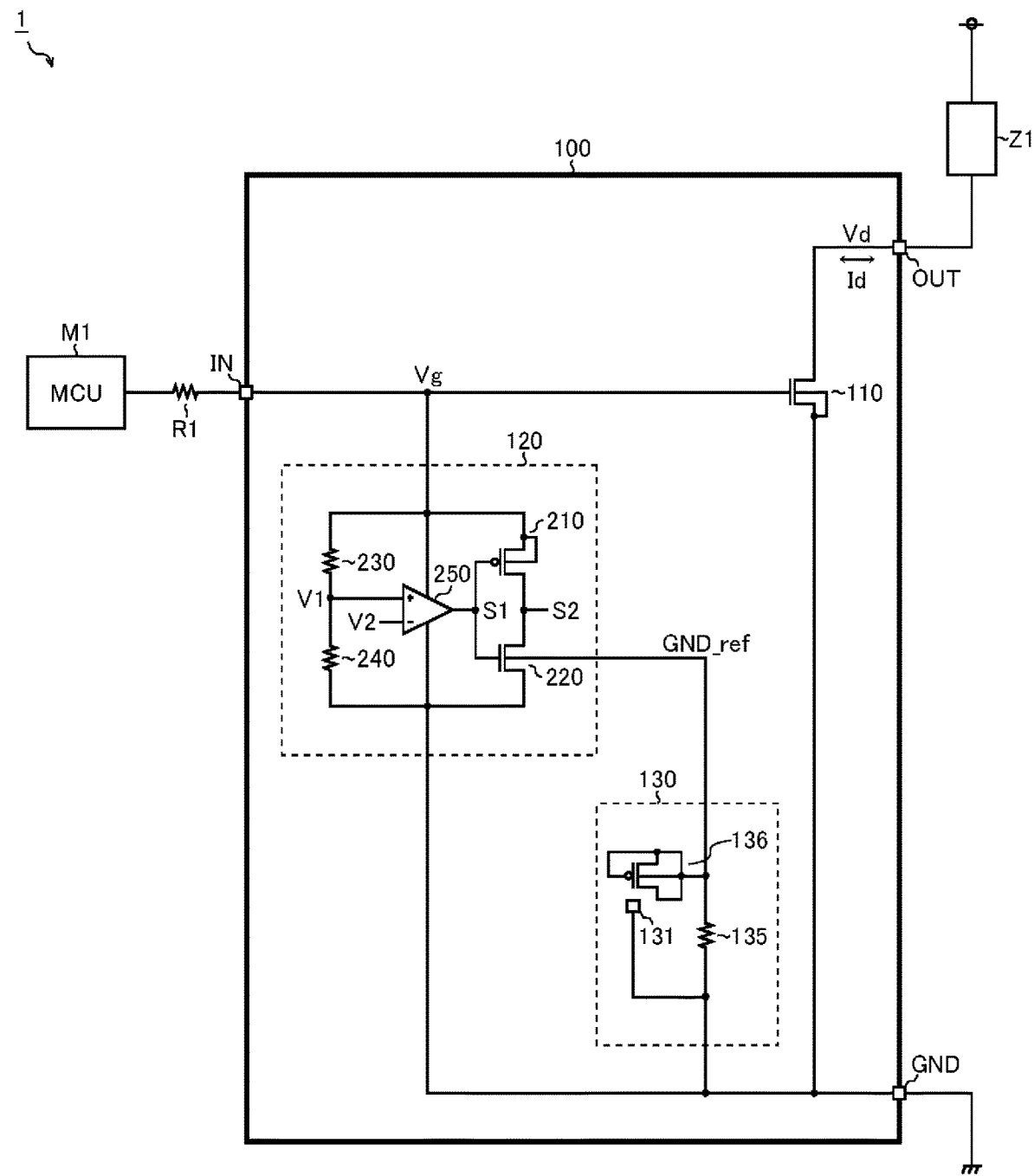
FIG. 5 is a circuit diagram showing a specific example of a controller and a potential separator.

FIG. 5 is a circuit diagram showing a specific example of the controller 120 and the potential separator 130. The controller 120 in this configuration example includes a pMOSFET 210, an nMOSFET 220, resistors 230 and 240, and a comparator 250. The source and the backgate of the pMOSFET 210 are both connected to a control terminal IN. The gate of the pMOSFET 210 and the gate of the nMOSFET 220 are both connected to the output terminal of the comparator 250 (a terminal to which a comparative signal S1 is applied). The drain of the pMOSFET 210 and the drain of the nMOSFET 220 are both connected to a terminal from which the output signal S2 is output. The source of the nMOSFET 220 is connected directly to a ground terminal GND. The backgate of the nMOSFET 220 is connected to the ground terminal GND via the potential separator 130.

The resistors 230 and 240 (with resistance values R230 and R240 respectively) are connected in series between the control terminal IN and the ground terminal GND, and output a division voltage V1 (={R240/(R230+R240)}×Vg) from the connection node between them.

The comparator 250 operates by use of the control voltage Vg as a power source, and compares the division voltage V1, which is fed to the non-inverting input terminal (+) of the comparator 250, with a predetermined threshold voltage V2, which is fed to the inverting input terminal (−) of the comparator 250, to output a comparative signal S1. The comparative signal S1 is at low level when the division voltage V1 is lower than the threshold voltage V2, and is at high level when the division voltage V1 is higher than the threshold voltage V2.

When the comparative signal S1 is at high level, the pMOSFET 210 is OFF and the nMOSFET 220 is ON, and thus the output signal S2 is at low level (=GND). On the other hand, when the comparative signal S1 is at low level, the pMOSFET 210 is ON and the nMOSFET 220 is OFF, and thus the output signal S2 is at high level (Vg). Thus, the pMOSFET 210 and the nMOSFET 220 function as an inverter output stage which generates the output signal S2 by logically inverting the comparative signal S1. The output signal S2 can be used, for example, as a power-on reset signal for an internal circuit included in the semiconductor device 100.

On the other hand, the potential separator 130 in this configuration example includes a resistor 135, and a pMOSFET 136 formed in the p-type well 131. The first terminal of the resistor 135 and the source, the drain, the gate, and the backgate of the pMOSFET 136 are all connected to the backgate (a terminal to which the node voltage GND_ref is applied) of the nMOSFET 220. On the other hand, the p-type well 131 and the second terminal of the resistor 135 are both connected to the ground terminal GND.

Figure 6:
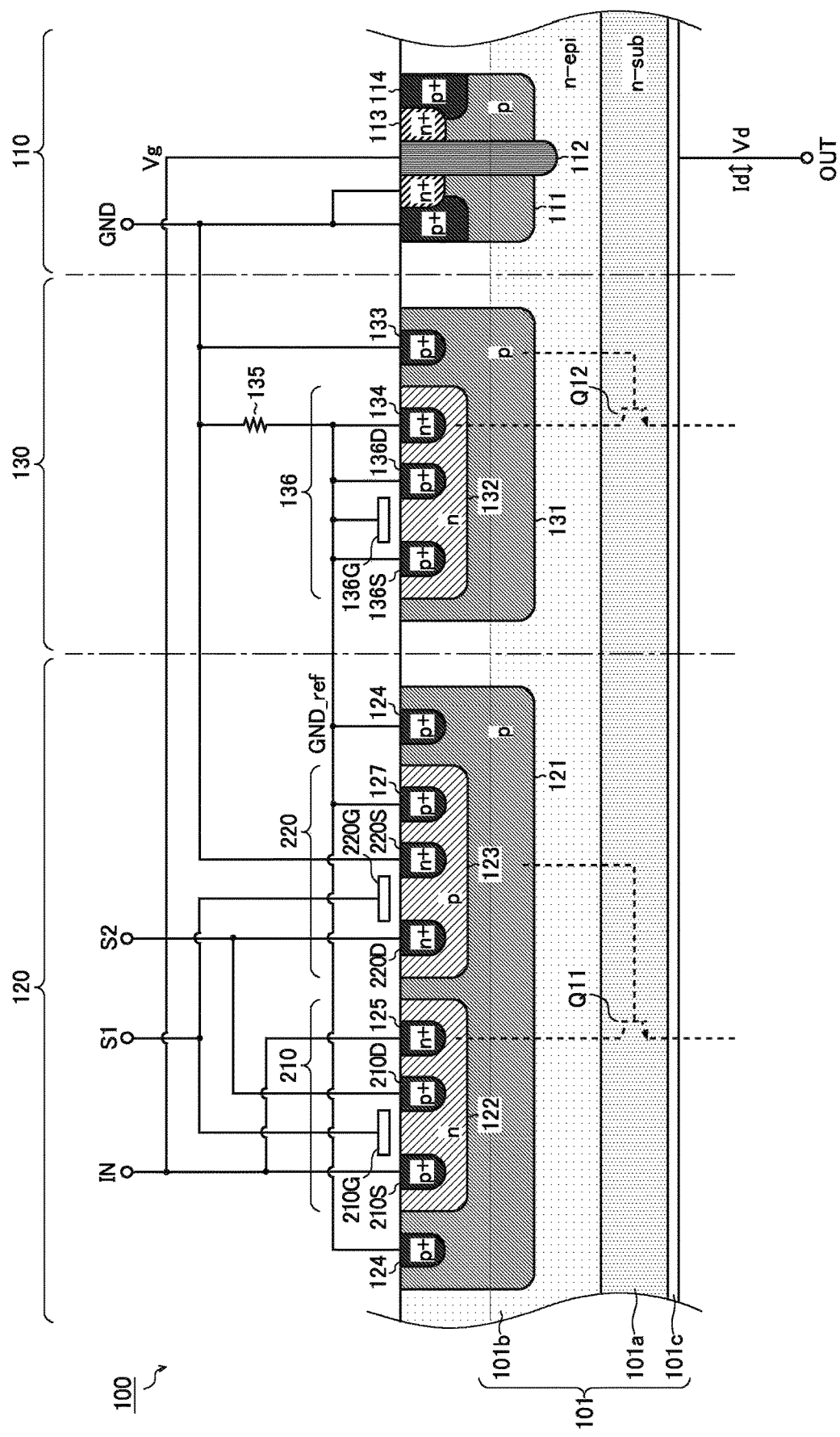
FIG. 6 is a vertical sectional view schematically showing a second structure example of a semiconductor device.

FIG. 6 is a vertical sectional view schematically showing a second structure example of the semiconductor device 100. FIG. 6 depicts, on the basis of the above-described first structure example (FIG. 3), a vertical structure example where the constituent elements (the pMOSFET 210, the nMOSFET 220, and the dummy pMOSFET 136) in FIG. 5 are specifically implemented. Thus, such constituent elements as find their counterparts in the first structure example are identified by the same reference signs as in FIG. 3, and no overlapping description will be repeated. The following description focuses on features peculiar to the second structure example.

First, the controller 120 will be described. In a region where the controller 120 is formed, a pMOSFET 210 is formed in the low-doped n-type semiconductor region 122. Specifically, in the low-doped n-type semiconductor region 122, other than the high-doped n-type semiconductor region 125 mentioned previously, high-doped p-type semiconductor regions 210S and 210D are formed. Over a channel region between the high-doped p-type semiconductor region 210S and the high-doped p-type semiconductor region 210D, a gate electrode 210G is formed.

The high-doped p-type semiconductor region 210S acts as the source of the pMOSFET 210, and is connected to the control terminal IN. The high-doped p-type semiconductor region 210D acts as the drain of the pMOSFET 210, and is connected to a terminal to which the output signal S2 is applied. The gate electrode 210G is connected to a terminal to which the comparative signal S1 is applied. The low-doped n-type semiconductor region 122 acts as the backgate of the pMOSFET 210, and is connected to the control terminal IN via the high-doped n-type semiconductor region 125.

In a region where the controller 120 is formed, an nMOSFET 220 is formed in the low-doped p-type semiconductor region 123. More specifically, in the low-doped p-type semiconductor region 123, other than the high-doped p-type semiconductor region 127 mentioned previously, high-doped n-type semiconductor regions 220D and 220S are formed. Over a channel region between the high-doped n-type semiconductor region 220D and the high-doped n-type semiconductor region 220S, a gate electrode 220G is formed.

The high-doped n-type semiconductor region 220D acts as the drain of the nMOSFET 220, and is connected to a terminal to which the output signal S2 is applied. The high-doped n-type semiconductor region 220S acts as the source of the nMOSFET 220, and is connected to the ground terminal GND. The gate electrode 220G is connected to a terminal to which the comparative signal S1 is applied. The low-doped p-type semiconductor region 123 (along with the p-type well 121 having a potential equal to that of the low-doped p-type semiconductor region 123) acts as the backgate of the nMOSFET 220, and is connected via the high-doped p-type semiconductor regions 127 and 124 to a terminal to which the node voltage GND_ref is applied.

A plurality of high-doped p-type semiconductor regions 124 acting as contacts of the p-type well 121 are preferably arranged in a peripheral edge part of the p-type well 121 so as to surround the low-doped n-type semiconductor region 122 and the low-doped p-type semiconductor region 123.

Next, the potential separator 130 will be described. In a region where the potential separator 130 is formed, a dummy pMOSFET 136 is formed in the low-doped n-type semiconductor region 132. More specifically, in the low-doped n-type semiconductor region 132, other than the high-doped n-type semiconductor region 134 mentioned previously, high-doped p-type semiconductor regions 136S and 136D are formed. Over a channel region between the high-doped p-type semiconductor region 136S and the high-doped p-type semiconductor region 136D, a gate electrode 136G is formed.

The high-doped p-type semiconductor regions 136S and 136D act as the source and the drain of the dummy pMOSFET 136 respectively. The low-doped n-type semiconductor region 132 (along with the high-doped n-type semiconductor region 134 which is the contact of the low-doped n-type semiconductor region 132) acts as the backgate of the dummy pMOSFET 136. The high-doped p-type semiconductor regions 136S and 136D, the high-doped n-type semiconductor region 134, and the gate electrode 136G are all connected to the ground terminal GND via the shared resistor 135. That is, the dummy pMOSFET 136 is short-circuited among all its terminals, and thus does not function as a transistor at all.

With this configuration where the backgate of the dummy pMOSFET 136 is used as the low-doped n-type semiconductor region 132, the potential separator 130 can be implemented by use of the very process for forming a pMOSFET, with no need for a special element forming process.

In the semiconductor device 100 of the second structure example, just as in the first structure example, the potential separator 130 serves to give the p-type well 121 and the ground terminal GND an equal potential when the output terminal OUT has a higher potential than the ground terminal GND, and to give the p-type well 121 and the output terminal OUT an equal potential when the output terminal OUT has a lower potential than the ground terminal GND.

Thus, even when the drain voltage Vd becomes negative, the parasitic transistor Q11 does not turn ON; thus, it is possible to prevent a drop in the voltage at the control terminal IN, and hence to maintain the normal operation of the semiconductor device 100.

Figure 7:
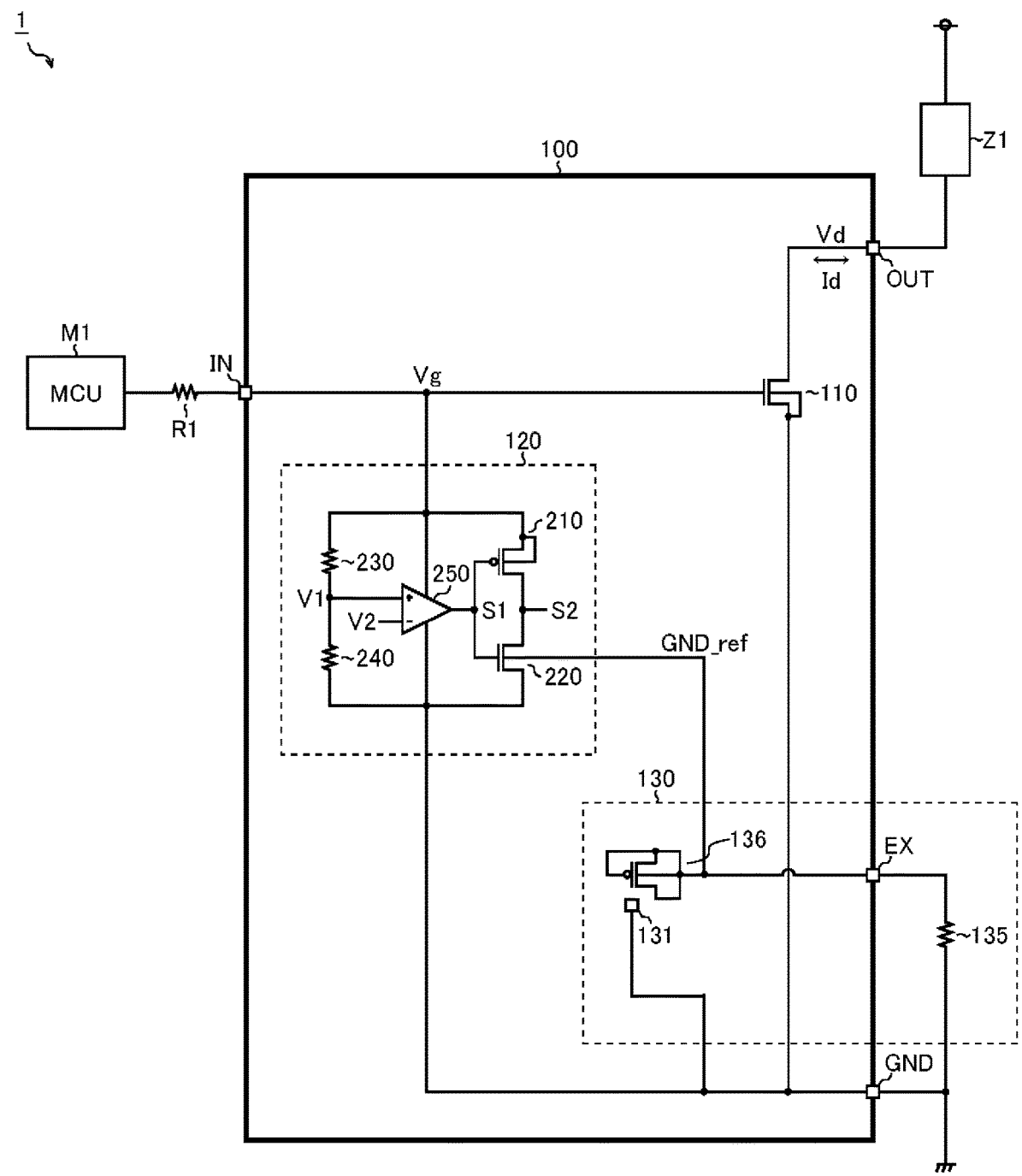
FIG. 7 is a circuit diagram showing a modified example of a potential separator.

FIG. 7 is a circuit diagram showing a modified example of the potential separator 130. The potential separator 130 of this modified example has basically the same structure as that in FIG. 5, except that, here, the resistor 135 is externally fitted. More specifically, the semiconductor device 100 has a resistor connection terminal EX for externally fitting the resistor 135 to the semiconductor device 100, and the resistor 135 is externally fitted between the resistor connection terminal EX and a ground terminal GND. The resistor connection terminal EX is connected, inside the semiconductor device 100, to a terminal to which the node voltage GND_ref is applied.

This modified example makes it easy to adjust as necessary the resistance value of the resistor 135 to a necessary and sufficient value according to the current capacity of the parasitic transistor Q12. This is in no way meant to limit the method for adjusting the resistance value; instead, for example, it is possible to adjust as necessary, by laser trimming or the like, the resistance value of the resistor 135 incorporated in the semiconductor device 100.

<Vehicle>

Figure 8:
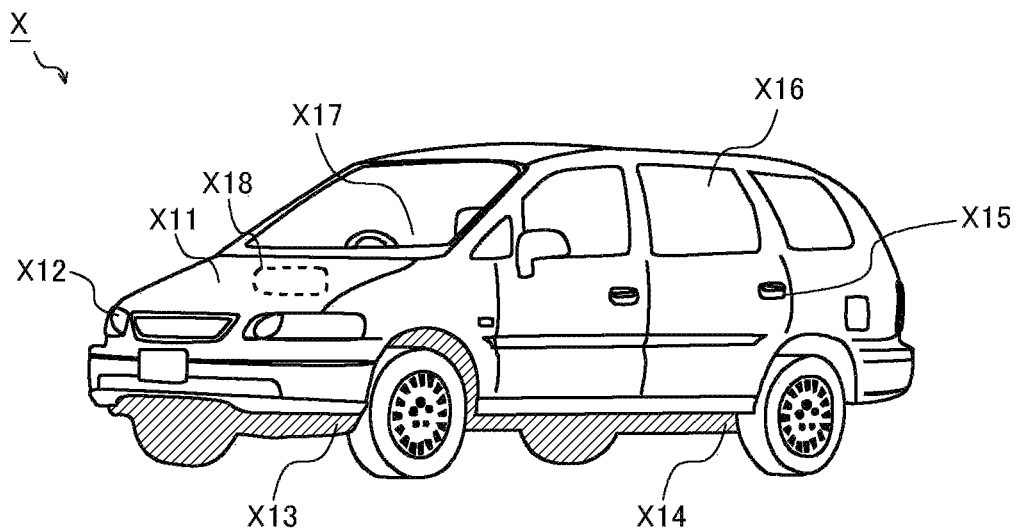
FIG. 8 is an exterior view showing a configuration example of a vehicle.

FIG. 8 is an exterior view showing a configuration example of a vehicle X. The vehicle X of this configuration example incorporates an unillustrated battery along with various electronic appliances X11 to X18 that operate by being fed with power from the battery. It should be noted that, for the sake of convenient illustration, any of the electronic appliances X11 to X18 shown in FIG. 8 may be located elsewhere in practice.

The electronic appliance X11 is an engine control unit which performs control with respect to an engine (injection control, electronic throttle control, idling control, oxygen sensor heater control, automatic cruise control, etc.).

The electronic appliance X12 is a lamp control unit which controls the lighting and extinguishing of HIDs (high-intensity discharged lamps), DRLs (daytime running lamps), etc.

The electronic appliance X13 is a transmission control unit which performs control with respect to a transmission.

The electronic appliance X14 is a body control unit which performs control with respect to the movement of the vehicle X (ABS (anti-lock brake system) control, EPS (electric power steering) control, electronic suspension control, etc.).

The electronic appliance X15 is a security control unit which drives and controls door locks, burglar alarms, and the like.

The electronic appliance X16 comprises electronic appliances incorporated in the vehicle X as standard or manufacturer-fitted equipment at the stage of factory shipment, such as wipers, power side mirrors, power windows, dampers (shock absorbers), a power sun roof, and power seats.

The electronic appliance X17 comprises electronic appliances fitted to the vehicle X optionally as user-fitted equipment, such as AIV (audio/visual) equipment, a car navigation system, and an ETC (electronic toll control system).

The electronic appliance X18 comprises electronic appliances provided with high-withstand-voltage motors, such as a vehicle-mounted blower, an oil pump, a water pump, and a battery cooling fan.

The semiconductor devices 10 and 100 described previously can be built in any of the electronic appliances X11 to X18.

<Modifications>

Thus, various technical features disclosed herein may be implemented in any other manner than in the embodiments described above, and allow for many modifications without departing from the spirit of the present invention. That is, the embodiments descried above should be understood to be in every aspect illustrative and not restrictive. The technical scope of the present invention is defined not by the description of the embodiments given above but by the appended claims, and should be understood to encompass any modifications made in the sense and scope equivalent to those of the claims.

INDUSTRIAL APPLICABILITY

The invention disclosed herein finds application in semiconductor devices in general (low-side switch ICs, switching power supply ICs, motor driver ICs, etc.) in which a negative voltage can be applied to an n-type semiconductor substrate.

LIST OF REFERENCE SIGNS 1 electronic appliance
10 semiconductor device
11 n-type semiconductor substrate
12 p-type well
13 n-type semiconductor region
14 potential separator
14a p-type well
14b n-type semiconductor region
14c resistor
100 semiconductor device
101 n-type semiconductor substrate
101a n-type substrate layer
101b n-type epitaxial growth layer
101c substrate electrode
110 output transistor
111 p-type well
112 trench gate
113 high-doped n-type semiconductor region
114 high-doped p-type semiconductor region
120 controller
121 p-type well
122 low-doped n-type semiconductor region
123 low-doped p-type semiconductor region
124, 127 high-doped p-type semiconductor region
125, 126 high-doped n-type semiconductor region
130 potential separator
131 p-type well
132 low-doped n-type semiconductor region
133 high-doped p-type semiconductor region
134 high-doped n-type semiconductor region
135 resistor
136 dummy pMOSFET
136S high-doped p-type semiconductor region (source)
136D high-doped p-type semiconductor region (drain)
136G gate electrode (gate)
210 pMOSFET
210S high-doped p-type semiconductor region (source)
210D high-doped p-type semiconductor region (drain)
210G gate electrode (gate)
220 nMOSFET
220S high-doped n-type semiconductor region (source)
220D high-doped n-type semiconductor region (drain)
220G gate electrode (gate)
230 comparator
240, 250 resistor
IN control terminal
OUT output terminal (load connection terminal)
GND ground terminal
EX resistor connection terminal
Q1, Q2, Q11, Q12 parasitic transistor
M1 microcontroller
R1 resistor
Z1 load
X vehicle
X11 to X18 electronic appliance

The invention claimed is:

1. A semiconductor device comprising:
 an n-type semiconductor substrate connected to an output terminal;
 a first p-type well formed in the n-type semiconductor substrate;
 a first n-type semiconductor region which is formed in the first p-type well and which is connected to a control terminal; and
 a potential separator connected between the first p-type well and a ground terminal, wherein
 the potential separator is configured to give the first p-type well and the ground terminal an equal potential when the output terminal has a potential higher than a potential of the ground terminal, and to give the first p-type well and the output terminal an equal potential when the output terminal has a potential lower than the potential of the ground terminal, wherein the potential separator includes:
  a second p-type well which is formed in the n-type semiconductor substrate and which is connected to the ground terminal; and
  a second n-type semiconductor region formed in the second p-type well,
  wherein the first p-type well and the second n-type semiconductor region are connected to the ground terminal via a shared resistor, and
  wherein the second n-type semiconductor region is configured to act as a backgate of a dummy pMOSFET formed in the second p-type well.

2. The semiconductor device of claim 1 further comprising:
 an external terminal for externally fitting the resistor.

3. The semiconductor device of claim 1, further comprising:
 an output transistor with a vertical structure which is connected between the output terminal and the ground terminal and which is configured to turn ON and OFF according to a control voltage fed from the control terminal; and
 a controller configured to operate by use of the control voltage as a power source, wherein
 the first p-type well and the first n-type semiconductor region are both constituent elements of the controller.

4. The semiconductor device of claim 3, wherein the controller includes:
 a pMOSFET connected between the control terminal and a gate of the output transistor; and
 an nMOSFET connected between the gate of the output transistor and the ground terminal, wherein
 the first p-type well is configured to act as a backgate of the nMOSFET, and
 the first n-type semiconductor region is configured to act as a backgate of the pMOSFET.

5. An electronic appliance comprising:
 the semiconductor device of claim 1;
 a microcontroller configured to supply a control voltage to the control terminal of the semiconductor device; and
 a load fitted externally to the output terminal of the semiconductor device.

6. The electronic appliance of claim 5 wherein the load is inductive.

7. The electronic appliance of claim 6, wherein the semiconductor device is a low-side switch IC, a switching power supply IC, or a motor driver IC.

8. A vehicle comprising:
the electronic appliance of claim 7; and
a battery configured to supply power to the electronic appliance.
9. A semiconductor device comprising:
an n-type semiconductor substrate connected to an output terminal;
a first p-type well formed in the n-type semiconductor substrate;
a first n-type semiconductor region which is formed in the first p-type well and which is connected to a control terminal; and
a potential separator connected between the first p-type well and a ground terminal, wherein
the potential separator is configured to give the first p-type well and the ground terminal an equal potential when the output terminal has a potential higher than a potential of the ground terminal, and to give the first p-type well and the output terminal an equal potential when the output terminal has a potential lower than the potential of the ground terminal,
wherein the semiconductor device further comprises:
an output transistor with a vertical structure which is connected between the output terminal and the ground terminal and which is configured to turn ON and OFF according to a control voltage fed from the control terminal; and
a controller configured to operate by use of the control voltage as a power source,
wherein the first p-well and the first n-type semiconductor region are both constituent elements of the controller,
wherein the controller includes:
a pMOSFET connected between the control terminal and a gate of the output transistor; and
an nMOSFET connected between the gate of the output transistor and the ground terminal,
wherein the first p-type well is configured to act as a backgate of the nMOSFET, and
wherein the first n-type semiconductor region is configured to act as a backgate of the pMOSFET.
10. A semiconductor device comprising:
an n-type semiconductor substrate connected to an output terminal;
a first p-type well formed in the n-type semiconductor substrate;
a first n-type semiconductor region which is formed in the first p-type well and which is connected to a control terminal; and
a potential separator connected between the first p-type well and a ground terminal, wherein the potential separator includes:
a second p-type well which is formed in the n-type semiconductor substrate and which is connected to the ground terminal; and
a second n-type semiconductor region formed in the second p-type well, and
the first p-type well and the second n-type semiconductor region are connected to the ground terminal via a shared resistor,
wherein the second n-type semiconductor region is configured to act as a backgate of a dummy pMOSFET formed in the second p-type well.
11. The semiconductor device of claim 10 further comprising:
an external terminal for externally fitting the resistor.

12. The semiconductor device of claim 10, further comprising:
an output transistor with a vertical structure which is connected between the output terminal and the ground terminal and which is configured to turn ON and OFF according to a control voltage fed from the control terminal; and
a controller configured to operate by use of the control voltage as a power source, wherein
the first p-type well and the first n-type semiconductor region are both constituent elements of the controller.
13. The semiconductor device of claim 12, wherein the controller includes:
a pMOSFET connected between the control terminal and a gate of the output transistor; and
an nMOSFET connected between the gate of the output transistor and the ground terminal, wherein
the first p-type well is configured to act as a backgate of the nMOSFET, and
the first n-type semiconductor region is configured to act as a backgate of the pMOSFET.
14. An electronic appliance comprising:
the semiconductor device of claim 10;
a microcontroller configured to supply a control voltage to the control terminal of the semiconductor device; and
a load fitted externally to the output terminal of the semiconductor device.
15. The electronic appliance of claim 14, wherein the load is inductive.
16. The electronic appliance of claim 15, wherein the semiconductor device is a low-side switch IC, a switching power supply IC, or a motor driver IC.
17. A vehicle comprising:
the electronic appliance of claim 16; and
a battery configured to supply power to the electronic appliance.
18. A semiconductor device comprising:
an n-type semiconductor substrate connected to an output terminal;
a first p-type well formed in the n-type semiconductor substrate;
a first n-type semiconductor region which is formed in the first p-type well and which is connected to a control terminal; and
a potential separator connected between the first p-type well and a ground terminal, wherein the potential separator includes:
a second p-type well which is formed in the n-type semiconductor substrate and which is connected to the ground terminal; and
a second n-type semiconductor region formed in the second p-type well, and
the first p-type well and the second n-type semiconductor region are connected to the ground terminal via a shared resistor,
wherein the semiconductor device further comprises:
an output transistor with a vertical structure which is connected between the output terminal and the ground terminal and which is configured to turn ON and OFF according to a control voltage fed from the control terminal; and
a controller configured to operate by use of the control voltage as a power source, wherein
the first p-well and the first n-type semiconductor region are both constituent elements of the controller,
wherein the controller includes:

a pMOSFET connected between the control terminal and a gate of the output transistor; and
an nMOSFET connected between the gate of the output transistor and the ground terminal,
wherein the first p-type well is configured to act as a backgate of the nMOSFET, and
wherein the first n-type semiconductor region is configured to act as a backgate of the pMOSFET.

* * * * *